US012794194B2

(12) United States Patent
Mu et al.

(10) Patent No.: US 12,794,194 B2
(45) Date of Patent: Nov. 10, 2026

(54) METHOD AND APPARATUS FOR CONTROLLING WAVELENGTH OF OPTICAL MODULE, AND STORAGE MEDIUM

(71) Applicant: Accelink Technologies Co., Ltd., Wuhan (CN)

(72) Inventors: Lei Mu, Wuhan (CN); Yang Ruan, Wuhan (CN); Kai Wang, Wuhan (CN); Zhi Yang, Wuhan (CN); Gang Pan, Wuhan (CN); Ran Liu, Wuhan (CN); Lei Liu, Wuhan (CN)

(73) Assignee: Accelink Technologies Co., Ltd., Wuhan City (CN)

( * ) Notice: Subject to any disclaimer, the term of this patent is extended or adjusted under 35 U.S.C. 154(b) by 639 days.

(21) Appl. No.: 18/551,568

(22) PCT Filed: May 7, 2021

(86) PCT No.: PCT/CN2021/092087
§ 371 (c)(1),
(2) Date: Sep. 20, 2023

(87) PCT Pub. No.: WO2022/198758
PCT Pub. Date: Sep. 29, 2022

(65) Prior Publication Data

US 2024/0170916 A1 May 23, 2024

(30) Foreign Application Priority Data

Mar. 22, 2021 (CN) ......................... 202110303329.5

(51) Int. Cl.

| | |
|---|---|
| ***H01S 5/0683*** | (2006.01) |
| ***H01S 5/06*** | (2006.01) |
| ***H01S 5/068*** | (2006.01) |

(52) U.S. Cl.
CPC ........ *H01S 5/06837* (2013.01); *H01S 5/0612* (2013.01); *H01S 5/06804* (2013.01)

(58) Field of Classification Search
CPC ............... H01S 5/06837; H01S 5/0612; H01S 5/06804; H04B 10/572
(Continued)

(56) References Cited

U.S. PATENT DOCUMENTS 5,604,758 A * 2/1997 AuYeung ............ H01S 5/02415 372/38.1
6,804,273 B1 * 10/2004 Sacchetto ............. H01S 5/0687 372/38.07
(Continued)

FOREIGN PATENT DOCUMENTS

CN 101369713 A 2/2009
CN 204481323 U 7/2015
(Continued)

OTHER PUBLICATIONS

International Search Report for PCT/CN2021/092087 dated Nov. 30, 2021.
(Continued)

*Primary Examiner* — Dalzid E Singh
(74) *Attorney, Agent, or Firm* — Lei Fang, Esq.; Smith Tempel Blaha LLC

(57) ABSTRACT

A method and an apparatus for controlling a wavelength of an optical module, and a storage medium. The method comprises: determining an initial temperature compensation curve corresponding to a transmitter optical subassembly TOSA in an optical module (S101); obtaining a first control voltage to be applied to a TEC according to a current ambient temperature and the initial temperature compensation curve; and controlling the TOSA to emit a first light wave based on the first control voltage, whose wavelength
(Continued)

is a first wavelength (S102); when the first wavelength does not meet a setting range, adjusting the control voltage applied to the TEC until the control voltage applied to the TEC reaches a second control voltage, the second control voltage being capable of controlling the TOSA to emit a second light wave at the current ambient temperature, whose wavelength is a second wavelength meeting the setting range; and updating the initial temperature compensation curve based on the second control voltage (S103).

20 Claims, 5 Drawing Sheets

(58) Field of Classification Search
USPC .......................................................... 398/136
See application file for complete search history.

(56) References Cited

U.S. PATENT DOCUMENTS

| | | | | |
|---|---|---|---|---|
| 6,947,455 | B2 * | 9/2005 | Chieng | H01S 5/06804 372/38.07 |
| 2002/0136249 | A1 * | 9/2002 | Akashi | H01S 5/0687 372/38.01 |
| 2007/0297468 | A1 * | 12/2007 | Stewart | H04B 10/503 257/E33.002 |
| 2016/0245557 | A1 * | 8/2016 | Schaefer | F25B 21/02 |

FOREIGN PATENT DOCUMENTS

| | | |
|---|---|---|
| CN | 105102085 A | 11/2015 |
| CN | 108808437 A | 11/2018 |

OTHER PUBLICATIONS

International Written Opinion for PCT/CN2021/092087 dated Nov. 30, 2021.

* cited by examiner

METHOD AND APPARATUS FOR CONTROLLING WAVELENGTH OF OPTICAL MODULE, AND STORAGE MEDIUM

CROSS-REFERENCE TO RELATED APPLICATIONS

This application is a 371 U.S. National Phase of PCT International Application No. PCT/CN2021/092087 filed on May 7, 2021, which claims benefit and priority to Chinese patent application No. CN202110303329.5 filed on Mar. 22, 2021. the contents of each of the above listed applications are incorporated by reference herein in their entireties.

TECHNICAL FIELD OF THE DISCLOSURE

The present disclosure relates to a technical field of optical communication, and in particular, to a method and an apparatus for controlling a wavelength of an optical module, and a storage medium.

BACKGROUND

An optical access network is composed of three portions: an optical line terminal (OLT), an optical network unit (ONU) and an optical distribution network (ODN), wherein the OLT is a core device of the optical access network, and a light emission module of the OLT is very sensitive to the temperature and needs to be maintained in a constant temperature range. Otherwise, the emitted light wavelength will drift, thereby affecting communication, especially in dense optical wavelength division multiplexing technology. Because a wavelength interval between different channels is only 0.8 nanometers (nm), when the channel wavelength is offset or the spectral width is broadened, it is easy to cause crosstalk between channels. Therefore, there is a very high requirement for the wavelength stability and spectral width of the signal source, and usually, a wavelength offset tolerance value of an optical module with dense wavelength division multiplexing (DWDM) in a full temperature range (i.e. the normal working temperature range) only has ±0.04 nm. However, in practical application, although that temperature of a die in a transmitter optical subassembly (TOSA) of the optical module is controlled at a constant value by using an automatic temperature control technology is capable of obviously improving the stability of the wavelength emitted by the optical module, but due to reasons on process, the temperature of the TOSA die under the control of a thermo electric cooler (TEC) in the TOSA is not strictly constant with the ambient temperature, which causes the wavelength of the optical signal emitted by the optical module will still offset in a case of high temperature and low temperature, especially for the TOSA which is packaged by using TransistorOut-line (TO), the offset of the wavelength emitted by the TOSA under the working condition at industrial temperature is very easy to exceed the tolerance value.

SUMMARY

In view of this, a main purpose of the present disclosure is to provide a method and an apparatus for controlling a wavelength of an optical module, and a storage medium, whereby the TEC temperature inside the die in the TOSA is changed in real time through a mode of fitting temperature compensation curve to compensate the wavelength offset, and the wavelength offset is monitored in real time so as to correct the temperature compensation curve in real time, so that the stability of the wavelength emitted by the optical module can be obviously improved.

In order to realize the above-mentioned purpose, the technical solution of the present disclosure is implemented as follows.

In a first aspect, embodiments of the present disclosure provides a method for controlling a wavelength of an optical module, and the method comprises:

- determining an initial temperature compensation curve corresponding to a transmitter optical subassembly TOSA in an optical module, wherein the initial temperature compensation curve is configured to reflect a relationship between a control voltage and an ambient temperature, and the control voltage is applied to a thermo electric cooler TEC in the TOSA and is configured to control the wavelength of the light wave emitted by the TOSA;
- obtaining a first control voltage to be applied to the TEC according to a current ambient temperature and the initial temperature compensation curve; and controlling the TOSA to emit a first light wave based on the first control voltage, wherein a wavelength of the first light wave is a first wavelength;
- in a case where the first wavelength does not meet a setting range, adjusting the control voltage applied to the TEC until the control voltage applied to the TEC reaches a second control voltage, wherein the second control voltage is capable of controlling the TOSA to emit a second light wave at the current ambient temperature, and a wavelength of the second light wave is a second wavelength meeting the setting range; and updating the initial temperature compensation curve on the basis of the second control voltage.

In an optional embodiment of the present disclosure, the determining an initial temperature compensation curve corresponding to a transmitter optical subassembly TOSA in an optical module comprises:

- obtaining a first relationship between a working temperature inside the TOSA and the ambient temperature; obtaining a second relationship between the working temperature and the control voltage applied to the TEC; and
- determining an initial temperature compensation curve corresponding to the TOSA based on the first relationship and the second relationship;
- wherein at the working temperature, the TOSA is capable of emitting a light wave with a wavelength meeting the setting range.

In an optional embodiment of the present disclosure, the adjusting the control voltage applied to the TEC until the control voltage applied to the TEC reaches a second control voltage comprises:

- adjusting the control voltage applied to the TEC based on a preset voltage stride and a current temperature inside the TOSA, and determining whether the wavelength of the light wave emitted by the TOSA meets the setting range or not, until the control voltage applied to the TEC reaches the second control voltage.

In an optional embodiment of the present disclosure, the adjusting the control voltage applied to the TEC based on a preset voltage stride and a current temperature inside the TOSA comprises:

- determining a voltage adjustment direction based on the current temperature and a preset working temperature range, wherein the preset working temperature range is a range of the working temperature to be met inside the TOSA when the wavelength of the light wave emitted by the TOSA meets the setting range;

adjusting the control voltage applied to the TEC based on the voltage adjustment direction and the preset voltage stride.

In an optional embodiment of the present disclosure, the determining a voltage adjustment direction based on the current temperature and a preset working temperature range comprises:

comparing the current temperature with a minimum value within the preset working temperature range to obtain a first comparison result; and comparing the current temperature with a maximum value within the preset working temperature range to obtain a second comparison result;

determining the voltage adjustment direction based on the first comparison result and the second comparison result;

wherein in a case where the first comparison result is that the current temperature is less than the minimum value and the second comparison result is that the current temperature is less than the maximum value, the voltage adjustment direction is to increase the control voltage applied to the TEC; and in a case where the first comparison result is that the current temperature is greater than the minimum value and the second comparison result is that the current temperature is greater than the maximum value, the voltage adjustment direction is to reduce the control voltage applied to the TEC.

In an optional embodiment of the present disclosure, in a case where the voltage adjustment direction is to increase the control voltage applied to the TEC, the adjusting the control voltage applied to the TEC based on the voltage adjustment direction and the preset voltage stride comprises: on the basis of the first control voltage, increasing the control voltage applied to the TEC by the preset voltage stride;

correspondingly, in a case where the voltage adjustment direction is to reduce the control voltage applied to the TEC, the adjusting the control voltage applied to the TEC based on the voltage adjustment direction and the preset voltage stride comprises: on the basis of the first control voltage, reducing the control voltage applied to the TEC by the preset voltage stride.

In an optional embodiment of the present disclosure, the updating the initial temperature compensation curve on the basis of the second control voltage comprises: composing the current ambient temperature and the second control voltage into a first coordinate, and obtaining a plurality of second coordinates on the initial temperature compensation curve, wherein the second coordinate is a coordinate composed of other ambient temperature except for the current ambient temperature and the corresponding control voltage on the initial temperature compensation curve; refitting a temperature compensation curve based on the first coordinate and the plurality of second coordinates, wherein the refitted temperature compensation curve is the updated initial temperature compensation curve;

or, in a case where the initial temperature compensation curve is a segmented line, the updating the initial temperature compensation curve on the basis of the second control voltage comprises:

determining an updating parameter corresponding to the initial temperature compensation curve based on the second control voltage and the initial temperature compensation curve;

updating the initial temperature compensation curve based on the updating parameter and a first coordinate composed of the current ambient temperature and the second control voltage.

In a second aspect, the embodiments of the present disclosure further provide a control apparatus for controlling a wavelength of an optical module, wherein the control apparatus comprises a determining unit, an obtaining unit, an adjusting unit and an updating unit, wherein the determining unit is configured to determine an initial temperature compensation curve corresponding to a transmitter optical subassembly TOSA in an optical module, wherein the initial temperature compensation curve is configured to reflect a relationship between a control voltage and an ambient temperature, and the control voltage is a control voltage applied to a thermo electric cooler TEC in the TOSA and is configured to control a wavelength of a light wave emitted by the TOSA;

the obtaining unit is configured to obtain a first control voltage to be applied to the TEC according to a current ambient temperature and the initial temperature compensation curve; and control the TOSA to emit a first light wave based on the first control voltage, wherein a wavelength of the first light wave is a first wavelength;

the adjusting unit is configured to adjust the control voltage applied to the TEC until the control voltage applied to the TEC reaches a second control voltage in a case where the first wavelength does not meet a setting range, wherein the second control voltage is capable of controlling the TOSA to emit a second light wave at the current ambient temperature, and a wavelength of the second light wave is a second wavelength meeting the setting range; and the updating unit is configured to update the initial temperature compensation curve on the basis of the second control voltage.

In an optional embodiment of the present disclosure, the determining unit is specifically configured to obtain a first relationship between a working temperature inside the TOSA and the ambient temperature; obtain a second relationship between the working temperature and the control voltage applied to the TEC; and determine the initial temperature compensation curve corresponding to the TOSA based on the first relationship and the second relationship, wherein at the working temperature, the TOSA is capable of emitting a light wave with a wavelength meeting the setting range.

In an optional embodiment of the present disclosure, the determining unit is specifically configured to adjust the control voltage applied to the TEC based on a preset voltage stride and a current temperature inside the TOSA, and determine whether the wavelength of the light wave emitted by the TOSA meets the setting range or not, until the control voltage applied to the TEC reaches a second control voltage.

In an optional embodiment of the present disclosure, the determining unit is further specifically configured to determine a voltage adjustment direction based on the current temperature and a preset working temperature range, wherein the preset working temperature range is a range of the working temperature to be met inside the TOSA when the wavelength of the light wave emitted by the TOSA meets the setting range;

adjusting the control voltage applied to the TEC based on the voltage adjustment direction and the preset voltage stride.

In an optional embodiment of the present disclosure, the adjusting unit is further specifically configured to compare the current temperature with a minimum value within the preset working temperature range to obtain a first comparison result; and compare the current temperature with a maximum value within the preset working temperature range to obtain a second comparison result; and determine the voltage adjustment direction based on the first comparison result and the second comparison result, wherein in a case where the first comparison result is that the current temperature is less than the minimum value and the second comparison result is that the current temperature is less than the maximum value, the voltage adjustment direction is to increase the control voltage applied to the TEC; and in a case where the first comparison result is that the current temperature is greater than the minimum value and the second comparison result is that the current temperature is greater than the maximum value, the voltage adjustment direction is to reduce the control voltage applied to the TEC.

In an optional embodiment of the present disclosure, the adjusting unit is further specifically configured as follows: in a case where the voltage adjustment direction is to increase the control voltage applied to the TEC, the adjusting the control voltage applied to the TEC based on the voltage adjustment direction and the preset voltage stride comprises: on the basis of the first control voltage, the control voltage applied to the TEC is increased by the preset voltage stride; correspondingly, the adjusting unit is further specifically configured as follows: in a case where the voltage adjustment direction is to reduce the control voltage applied to the TEC, on the basis of the first control voltage, the control voltage applied to the TEC is reduced by the preset voltage stride.

In an optional embodiment of the present disclosure, the adjusting unit is specifically configured as follows: the updating the initial temperature compensation curve on the basis of the second control voltage comprises: composing the current ambient temperature and the second control voltage into a first coordinate, and obtaining a plurality of second coordinates on the initial temperature compensation curve, wherein the second coordinate is a coordinate composed of other ambient temperature except for the current ambient temperature and the corresponding control voltage on the initial temperature compensation curve; refitting a temperature compensation curve based on the first coordinate and the plurality of second coordinates, wherein the refitted temperature compensation curve is the updated initial temperature compensation curve;

or, the adjusting unit is specifically configured as follows: determining an updating parameter corresponding to the initial temperature compensation curve based on the second control voltage and the initial temperature compensation curve;

updating the initial temperature compensation curve based on the updating parameter and a first coordinate composed of the current ambient temperature and the second control voltage.

In a third aspect, the embodiments of the present disclosure further provide a computer readable storage medium having a computer program stored thereon, and the computer program, when executed by a processor, implements the steps of the method.

In a fourth aspect, the embodiments of the present disclosure further provide an apparatus for controlling a wavelength of an optical module, the control apparatus comprises: a processor, and a memory configured to store a computer program capable of operating on the processor, wherein the processor, when operating the computer program, is configured to execute the steps of the method.

The embodiments of the present disclosure provide a method and an apparatus for controlling a wavelength of an optical module, and a storage medium. The method comprises: determining an initial temperature compensation curve corresponding to a transmitter optical subassembly TOSA in an optical module, wherein the initial temperature compensation curve is configured to reflect a relationship between a control voltage and an ambient temperature, wherein the control voltage is a control voltage applied to a thermo electric cooler TEC in the TOSA and is configured to control a wavelength of a light wave emitted by the TOSA; obtaining a first control voltage to be applied to the TEC according to a current ambient temperature and the initial temperature compensation curve; and controlling the TOSA to emit a first light wave based on the first control voltage, wherein a wavelength of the first light wave is a first wavelength; in a case where the first wavelength does not meet a setting range, adjusting the control voltage applied to the TEC until the control voltage applied to the TEC reaches a second control voltage, wherein the second control voltage is capable of controlling the TOSA to emit a second light wave at the current ambient temperature, and a wavelength of the second light wave is a second wavelength meeting the setting range; and updating the initial temperature compensation curve on the basis of the second control voltage. The method changes the voltage applied to the TEC through the mode of fitting the initial temperature compensation curve, thus controlling the temperature inside the TOSA die, based on this, controlling the offset of the wavelength emitted by the TOSA, and monitoring the wavelength in real time, so as to correct the initial temperature compensation curve in real time. As a result, the stability of the wavelength emitted by the optical module can be obviously improved.

DETAILED DESCRIPTION

In order to make the objectives, technical solutions and advantages of the embodiments of the present disclosure more obvious, the technical solutions of the present disclosure will be further described in detail below in conjunction with the accompanying drawings in the embodiments of the present disclosure. The following embodiments are configured to illustrate the present disclosure but are not used to limit its scope of the present disclosure.

The main idea of the method for controlling a wavelength of an optical module provided by the embodiments of the present disclosure is as follows: obtaining an initial temperature compensation curve with a relationship between a control voltage applied to a TEC inside a TOSA tube in an optical module and an ambient temperature, then obtaining the control voltage to be applied to the TEC according to the initial temperature compensation curve and the current ambient temperature, and then, controlling the temperature inside the TOSA die, thereby controlling a wavelength of a light wave emitted by the TOSA, so as to make the wavelength of the emitted light wave be stable. However, when the initial temperature compensation curve cannot ensure the wavelength of the light wave emitted by the TOSA be stable due to the reasons of hardware, the control voltage applied to the TEC should be adjusted so as to make the TOSA to emit the light wave with stable wavelength, and the initial temperature compensation curve is updated, so that the temperature compensation curve used next time is capable of ensuring that the TOSA emits the light wave with stable wavelength.

The present disclosure will be further described in detail in conjunction with the accompanying drawings and the specific embodiments.

Figure 1:
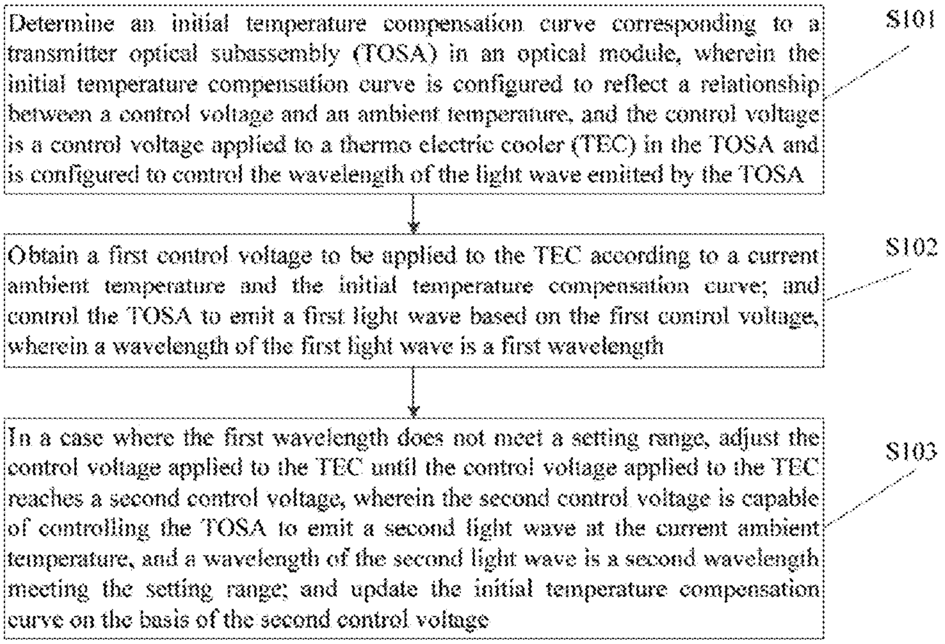
FIG. 1 is a schematic flowchart of a method for controlling a wavelength of an optical module provided by an embodiment of the present disclosure.

FIG. 1 is a schematic flowchart of a method for controlling a wavelength of an optical module provided by an embodiment of the present disclosure. As shown in FIG. 1, the method comprises:

S101: determining an initial temperature compensation curve corresponding to a transmitter optical subassembly (TOSA) in an optical module, wherein the initial temperature compensation curve is configured to reflect a relationship between a control voltage and an ambient temperature, and the control voltage is a control voltage applied to a thermo electric cooler (TEC) in the TOSA and is configured to control the wavelength of the light wave emitted by the TOSA.

Here, for S101, it may comprise: obtaining a first relationship between a working temperature inside the TOSA and the ambient temperature; and obtaining a second relationship between the working temperature and the control voltage applied to the TEC; determining the initial temperature compensation curve corresponding to the TOSA based on the first relationship and the second relationship, wherein at the working temperature, the TOSA is capable of emitting a light wave with a wavelength meeting the setting range.

It should be noted that the words "first" and "second" in the first relationship and the second relationship mentioned herein are only for convenience of description and are not configured to limit the present disclosure. The ambient temperature may be referred to a temperature of a natural environment in which the optical module works; and the working temperature may refer to a temperature to be met inside a the TOSA die when the TOSA is capable of emitting a light wave with a wavelength meeting the setting range. The setting range needs to be determined based on a tolerance value for a wavelength offset by a optical communication network in which an optical module works. For example, in the afore-mentioned optical communication network of the DWDM, the tolerance value for the wavelength offset is only ±0.04 nm, then at this time, the setting range is −0.04 nm~+0.04 nm.

In an actual application process, the first relationship is a relationship between the setting value of the TEC temperature inside the TOSA die (i.e. the numerical value of the working temperature) and the ambient temperature when the universal same-type optical module realizes emitting the light wave with the stable wavelength. it is obtained after many experimental tests, and the specific implementation process can be: by counting different sample data, the data of the universal temperature value inside the optical module laser die under different temperature conditions changed along with the external temperature is obtained, and is fitted, so that the TEC temperature curve changing along with the external temperature is obtained. After a large number of experiments, it can be seen that the relationship between the TEC temperature inside the TOSA die and the ambient temperature presents a one-variable function relationship. The second relationship is a relationship between the setting value of the TEC temperature inside the TOSA die and the control voltage applied to the TEC. It is proved through a large number of experiments that the temperature inside the TOSA die is mainly controlled by the TEC voltage in the TEC circuit, moreover, the temperature inside the TOSA die and the TEC voltage have a one-to-one correspondence relationship. That is to say, the second relationship is a relationship between the setting value of the TEC temperature inside the TOSA die and the control voltage applied to the TEC, which is also a relationship in a one-variable function relationship. Then in this case, after the function expression of the first relationship and the function expression of the second relationship are obtained, through a simple conversion, the relationship between the control voltage applied to the TEC and the ambient temperature can be obtained, i.e., the initial temperature compensation curve.

S102: obtaining a first control voltage to be applied to the TEC according to a current ambient temperature and the initial temperature compensation curve; and controlling the TOSA to emit a first light wave based on the first control voltage, wherein a wavelength of the first light wave is a first wavelength.

It should be noted that the process described here can be understood as: when the optical module works normally, by monitoring the current ambient temperature in real time, and then by calling the pre-stored initial temperature compensation curve, obtaining the control voltage to be loaded to the TEC in the TOSA at this time by calculating according to the current ambient temperature, then applying the obtained control voltage to be loaded to the TEC in the TOSA by calculating to the TEC, so as to control the temperature inside the TOSA die, furthermore, making the TOSA to emit the first light wave with the first wavelength.

In theory, the afore-mentioned first wavelength is in line with the setting range, but due to the consistency deviation of the chip or device, and the other reasons, the first wavelength does not meet the setting range; that is, the first wavelength is unstable. At this time, in practical application, the TOSA needs to be monitored according to the first wavelength of the first light wave emitted by the TOSA depending on the initial temperature compensation curve, and determining whether the first wavelength meets the setting range or not.

In a case where the first wavelength meets the setting range, no adjustment processing is needed; and in a case where the first wavelength does not meet the setting range, the wavelength of the light wave emitted by the TOSA is adjusted according to S103 and the initial temperature compensation curve is updated.

S103: in a case where the first wavelength does not meet a setting range, adjusting the control voltage applied to the TEC until the control voltage applied to the TEC reaches a second control voltage, wherein the second control voltage is capable of controlling the TOSA to emit a second light wave at the current ambient temperature, and a wavelength of the second light wave is a second wavelength meeting the setting range; and updating the initial temperature compensation curve on the basis of the second control voltage.

It should be noted that the words "first" and "second" in the first wavelength and the second wavelength mentioned herein are only for convenience of description and are not configured to limit the present disclosure.

Here, the adjusting the control voltage applied to the TEC until the control voltage applied to the TEC reaches a second control voltage in S103, comprises:

S1031: adjusting the control voltage applied to the TEC based on a preset voltage stride and a current temperature inside the TOSA, and determining whether the wavelength of the light wave emitted by the TOSA meets a setting range or not, until the control voltage applied to the TEC reaches the second control voltage.

The adjusting the control voltage applied to the TEC based on a preset voltage stride and a current temperature inside the TOSA in S1031, comprises:

S1031-1: determining a voltage adjustment direction based on the current temperature and a preset working temperature range, wherein the preset working temperature range is a range of the working temperature to be met inside the TOSA when the wavelength of the light wave emitted by the TOSA meets the setting range;

S1031-2: adjusting the control voltage applied to the TEC based on the voltage adjustment direction and the preset voltage stride.

For S1031-1, it may comprise: comparing the current temperature with a minimum value within the preset working temperature range to obtain a first comparison result; and comparing the current temperature with a maximum value within the preset working temperature range to obtain a second comparison result;

- determining the voltage adjustment direction based on the first comparison result and the second comparison result;
- wherein in a case where the first comparison result is that the current temperature is less than the minimum value and the second comparison result is that the current temperature is less than the maximum value, the voltage adjustment direction is to increase the control voltage applied to the TEC; and in a case where the first comparison result is that the current temperature is greater than the minimum value and the second comparison result is that the current temperature is greater than the maximum value, the voltage adjustment direction is to reduce the control voltage applied to the TEC.

For S1031-2, it may comprise: in a case where the voltage adjustment direction is to increase the control voltage applied to the TEC, the adjusting the control voltage applied to the TEC based on the voltage adjustment direction and the preset voltage stride comprises: on the basis of the first control voltage, increasing the control voltage applied to the TEC by the preset voltage stride;

- correspondingly, in a case where the voltage adjustment direction is to reduce the control voltage applied to the TEC, the adjusting the control voltage applied to the TEC based on the voltage adjustment direction and the preset voltage stride comprises: on the basis of the first control voltage, reducing the control voltage applied to the TEC by the preset voltage stride.

It should be noted that, for the adjusting the control voltage applied to the TEC until the control voltage applied to the TEC reaches a second control voltage in S103, it is a cycle step, and it means that in a case where the first wavelength does not meet a setting range, the adjustment direction of the control voltage applied to the TEC is determined based on the current temperature inside the TOSA and the preset working temperature range of the TOSA, then the control voltage applied to the TEC is adjusted according to the determined adjustment direction and the preset voltage step, then the adjusted control voltage is applied to the TEC, and then the temperature inside the TOSA die is controlled, thereby controlling the wavelength of the light wave emitted by the TOSA; next, whether the wavelength of the light wave newly emitted by the TOSA meets the setting range is determined, and if it is satisfied, the control voltage at this time is recorded as the second control voltage, and there is no need for further adjustment; if it is not satisfied, the afore-mentioned adjustment step continues until the wavelength of the light wave emitted by the TOSA meets the setting range, and the control voltage at this time is recorded as the second control voltage. It should be noted that when the adjustment is repeated, all of the adjustments are performed according to the same preset voltage stride. That is to say, when the wavelength does not meet the requirement, the voltage applied to the TEC progressively increases or decreases according to the same stride until the wavelength meets the requirement.

Here, the preset voltage stride is set according to the used different control algorithms, and the control algorithm may be proportional integral (PI), proportional integral derivative (PID) and the like. The current temperature may be measured by using a temperature sensor installed in the TOSA, and the temperature sensor may be a thermistor and the like.

In some embodiments, the updating the initial temperature compensation curve on the basis of the second control voltage in S103, may comprise:

- composing the current ambient temperature and the second control voltage into a first coordinate, and obtaining a plurality of second coordinates on the initial temperature compensation curve, wherein the second coordinate is a coordinate composed of other ambient temperature except for the current ambient temperature and the corresponding control voltage on the initial temperature compensation curve; refitting a temperature compensation curve based on the first coordinate and the plurality of second coordinates, wherein the refitted temperature compensation curve is the updated initial temperature compensation curve.

Alternatively, in a case where the initial temperature compensation curve is a segmented line, the updating the initial temperature compensation curve on the basis of the second control voltage comprises:

- determining an updating parameter corresponding to the initial temperature compensation curve based on the second control voltage and the initial temperature compensation curve;
- updating the initial temperature compensation curve based on the updating parameter and a first coordinate composed of the current ambient temperature and the second control voltage.

it should be noted that the first method for updating the initial temperature compensation curve in this step is actually replacing a coordinate point composed of a first control voltage incapable of enabling the wavelength of the light wave emitted by the TOSA to meet the setting range under the current ambient temperature on an original initial temperature compensation curve, with a coordinate point composed of the current ambient temperature and the second control voltage which enables the wavelength of the light wave emitted by the TOSA to meet the setting range, then finding a plurality of coordinates from the initial temperature compensation curve, and then refitting an initial temperature compensation curve based on these coordinate points.

For the second method for updating the initial temperature compensation curve actually is when the initial temperature compensation curve is a linear function composed of multiple line segments, obtaining an updating parameter, and translating the initial temperature compensation curve to obtain an updated temperature compensation curve for later use.

Figure 2:
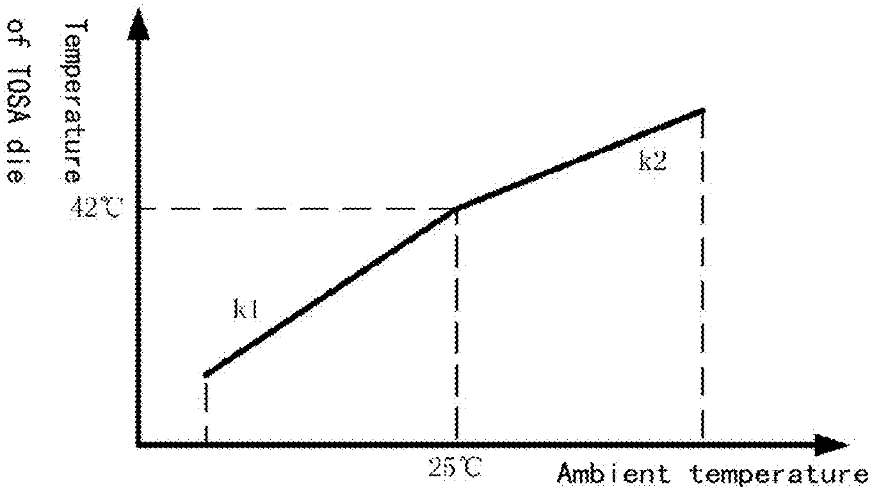
FIG. 2 is a schematic diagram of temperature inside a TOSA die changing with ambient temperature provided by an embodiment of the present disclosure.
Figure 3:
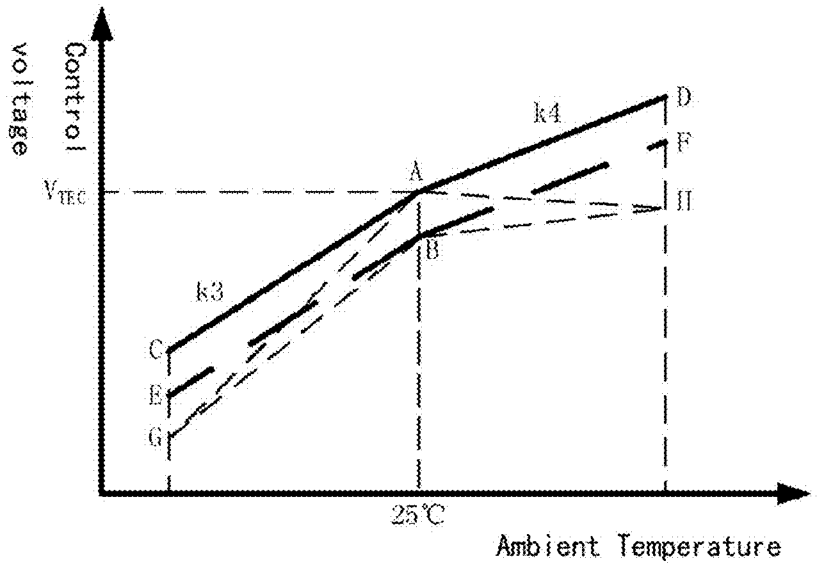
FIG. 3 is a schematic diagram of an initial temperature compensation curve and an updated initial temperature compensation curve provided by an embodiment of the present disclosure.

It should be noted that the updating parameter mentioned here includes a plurality of updating parameters, which is determined depending on a specific updating method. As shown in FIG. 2 and FIG. 3, it is an optional embodiment. It should be noted that FIG. 2 is a schematic diagram of temperature inside a TOSA die changing with an ambient temperature provided by an embodiment of the present disclosure; FIG. 3 is a schematic diagram of an initial temperature compensation curve and an updated initial temperature compensation curve provided by an embodiment of the present disclosure. In FIG. 2, the segmented line is a two-segment line. It is divided into a low-temperature segment and a high-temperature segment by taking the normal temperature of 25° ° C. as a demarcation point. The slope of each segment is k1 and k2, respectively, and A, C and D are working points corresponding to the optical module at normal temperature, low temperature and high temperature respectively. In FIG. 3, the initial temperature compensation curve is also two-segment line, and is also divided into a low-temperature segment and a high-temperature segment by taking the normal temperature of 25° C. as a demarcation point; however, the slope of each segment is k3 and k4, respectively. In this case, when the first wavelength of the first light wave emitted by the TOSA does not meet the setting range, the specific updating process of the initial temperature compensation curve is as follows:

in the first step, obtaining the control voltage applied to the TEC at a normal temperature (typically 25° C.) by using the initial temperature compensation curve, so as to make the optical module work at point A shown in FIG. 3. At this time, the wavelength of the light wave emitted by the TOSA is monitored, and when the wavelength meets the requirement (the wavelength meets the setting range), the coordinate of point A (the coordinate composed of the ambient temperature and the control voltage) at this time is recorded. When the wavelength does not meet the requirement, the control voltage applied to the TEC is progressively increased or decreased according to the same preset voltage stride until the wavelength meets the requirement, then the control voltage applied to the TEC at a normal temperature at this time is recorded, assuming as point B in FIG. 3.

In the second step, correcting the high-temperature segment temperature compensation curve. At the normal temperature, whether the TEC works at point A or point B, a TEC voltage real-time adjustment module calls a slope k4 of the initial temperature compensation curve, so that the TEC works at the point D or point F at the high-temperature boundary (at the normal temperature, if the TEC works at point A, then at the high temperature, the TEC works at point D, and at the normal temperature, if the TEC works at point B, then at the high temperature, the TEC works at point F). At this time, the TEC voltage real-time adjustment module judges according to the feedback result of the wavelength meter. If the wavelength of the optical module meets the requirement at this time, the high-temperature segment temperature compensation curve uses AD or BF. If the wavelength does not meet the requirement, the TEC voltage real-time adjustment module progressively increases or progressively decreases the TEC voltage according to the same stride until the wavelength meets the requirement. At this time, the TEC voltage real-time adjustment module records the new working point H of the TEC, and refits the high-temperature segment temperature compensation curve AH or BH according to the working point A or B of the normal temperature. At this point, the optical module has completed the redrawing of the temperature compensation curve of the high-temperature segment, and storing it in the register.

In the third step, correcting the low-temperature segment temperature compensation curve in the same method as correcting the high-temperature segment temperature compensation curve. At the normal temperature, whether the TEC works at point A or point B, a TEC voltage real-time adjustment module calls a slope k3 of the initial temperature compensation curve, so that the TEC works at point C or point E at the low-temperature boundary (at the normal temperature, if the TEC works at point A, then at the high temperature, TEC works at point C, and at the normal temperature, if the TEC works at point B, then at the high temperature, TEC works at point E). At this time, the TEC voltage real-time adjustment module judges according to the feedback result of the wavelength monitoring module. If the wavelength of the optical module meets the requirement at this time, then the low-temperature segment temperature compensation curve uses AC or BE. If the wavelength does not meet the requirement, then the TEC voltage real-time adjustment module progressively increases or progressively decreases the TEC voltage according to the same stride until the wavelength meets the requirement. At this time, the TEC voltage real-time adjustment module records the new working point G of the TEC and refits the high-temperature segment temperature compensation curve AG or BG according to the working point A or B of the normal temperature. At this point in time, the optical module has completed the redrawing of the high-temperature segment temperature compensation curve, and storing it in the register.

Here, only the adjustment processes when the wavelengths emitted by the optical module at three temperature points of normal temperature, high temperature and low temperature offsets beyond the wavelength tolerance value range of the optical communication network are listed, and other processes are similar. It should be noted that the updating parameters described herein may be the aforementioned parameters such as work point coordinates and slopes required for refitting temperature compensation curve, and the like.

The method for controlling a wavelength of an optical module provided by the embodiments of the present disclosure changes the voltage applied to the TEC through the mode of fitting the initial temperature compensation curve, thereby controlling the temperature inside the TOSA die, and based on this, controlling the offset of the wavelength emitted by the TOSA, and monitoring the wavelength in real time, so as to correct the initial temperature compensation curve in real time, so that the stability of the wavelength emitted by the optical module can be obviously improved.

Figure 4:
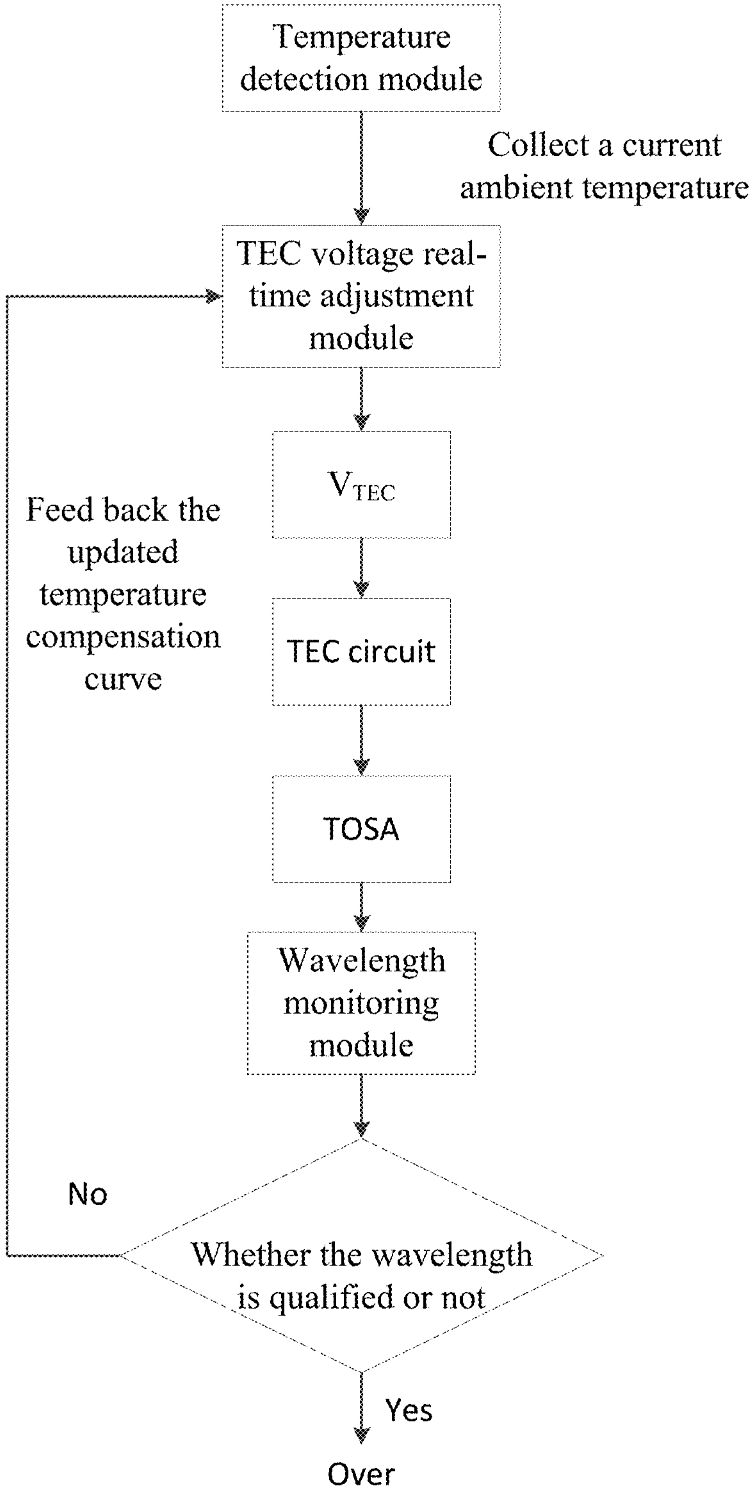
FIG. 4 is a implementation schematic flowchart of a method for controlling a wavelength of an optical module provided by an embodiment of the present disclosure.

In order to understand the embodiments of the present disclosure, as shown in FIG. 4, it is an implementation schematic flowchart of a method for controlling a wavelength of an optical module provided by an embodiment of the present disclosure. In FIG. 4, this process comprises:

collecting a current ambient temperature through a temperature detection module, and sending the current ambient temperature to a TEC voltage real-time adjustment module; obtaining, by the TEC voltage real-time adjustment module, a first control voltage $V_{TEC}$ to be applied to a TEC according to the current ambient temperature and a stored initial temperature compensation curve, and applying the first control voltage $V_{TEC}$ to a TEC circuit to control the temperature inside a TOSA die; emitting, by the TOSA at this temperature, a first light wave, where a wavelength of the first light wave is a first wavelength; then, determining, by a wavelength monitoring module, whether the wavelength of the first light wave is qualified or not (i.e. whether the first wavelength meets a setting range), and ending the process when the wavelength of the first light wave is qualified, that is to say, there is no need to adjust the first light wave; when the wavelength of the first light wave is unqualified, adjusting the control voltage applied to the TEC circuit until the wavelength monitoring module determines that the wavelength of the light wave emitted by the TOSA is qualified, and recording the control voltage applied to the TEC circuit at this time as a first control voltage, wherein the light wave at this time is a second light wave, and the wavelength thereof is a second wavelength; then updating the initial temperature compensation curve based on the second control voltage, and feeding back the updated initial temperature compensation curve to the TEC voltage real-time adjustment module for next use.

It should be noted that the TEC voltage real-time adjustment module, the wavelength monitoring module and the TEC circuit in this process are all installed in the optical module. In addition, the optical module further comprises a microcontroller unit (MCU), which is configured to control operation of the whole process, wherein the MCU may be a single chip microcomputer.

Figure 5:
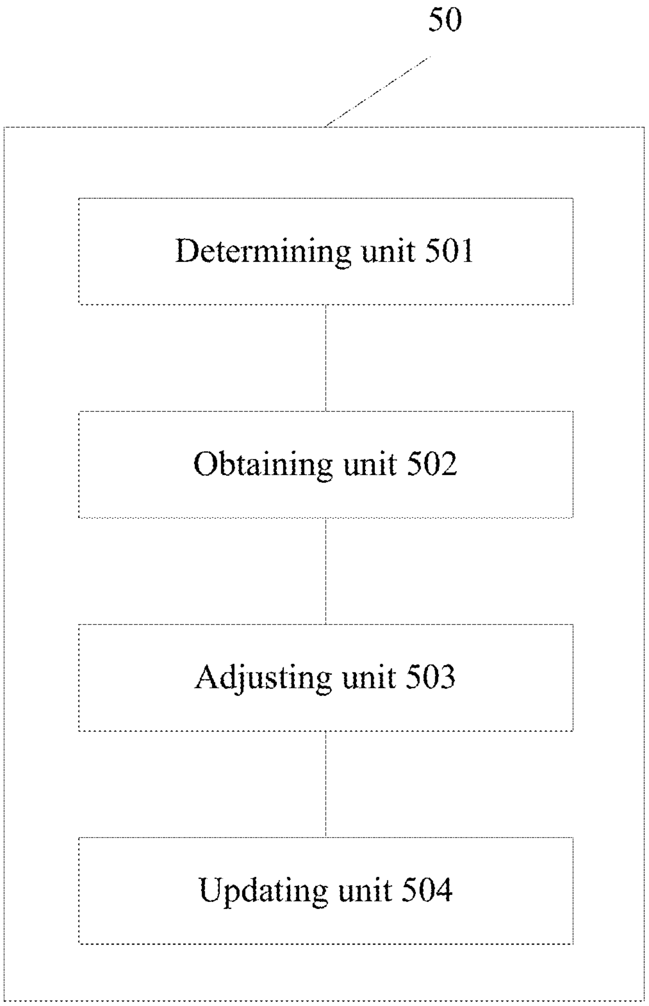
FIG. 5 is a schematic structural diagram of an apparatus for controlling a wavelength of an optical module provided by an embodiment of the present disclosure.

Based on the same invention concept, the embodiments of the present disclosure further provide an apparatus for controlling a wavelength of an optical module as shown in FIG. 5. FIG. 5 is a schematic structural diagram of an apparatus for controlling a wavelength of an optical module provided by an embodiment of the present disclosure. In FIG. 5, the control apparatus 50 includes a determining unit 501, an obtaining unit 502, an adjusting unit 503 and an updating unit 504.

The determining unit 501 is configured to determine an initial temperature compensation curve corresponding to a transmitter optical subassembly (TOSA) in an optical module. The initial temperature compensation curve is configured to reflect a relationship between a control voltage and an ambient temperature. The control voltage is a control voltage applied to a thermo electric cooler (TEC) in the TOSA and is configured to control the wavelength of the light wave emitted by the TOSA.

The obtaining unit 502 is configured to obtain a first control voltage to be applied to the TEC according to a current ambient temperature and the initial temperature compensation curve, and control the TOSA to emit a first light wave based on the first control voltage, wherein a wavelength of the first light wave is a first wavelength.

The adjusting unit 503 is configured to adjust the control voltage applied to the TEC until the control voltage applied to the TEC reaches a second control voltage in a case where the first wavelength does not meet a setting range, wherein the second control voltage is capable of controlling the TOSA to emit a second light wave at the current ambient temperature, and a wavelength of the second light wave is a second wavelength meeting the setting range.

The updating unit 504 is configured to update the initial temperature compensation curve on the basis of the second control voltage.

In some embodiments, the determining unit 501 is specifically configured to obtain a first relationship between a working temperature inside the TOSA and the ambient temperature, obtain a second relationship between the working temperature and the control voltage applied to the TEC, and determine an initial temperature compensation curve corresponding to the TOSA based on the first relationship and the second relationship, wherein at the working temperature, the TOSA is capable of emitting a light wave with a wavelength meeting the setting range.

In some embodiments, the adjusting unit 503 is specifically configured to adjust the control voltage applied to the TEC based on a preset voltage stride and a current temperature inside the TOSA, and determine whether a wavelength of the light wave emitted by the TOSA meets the setting range or not, until the control voltage applied to the TEC reaches the second control voltage.

In some embodiments, the adjusting unit 503 is further specifically configured to determine a voltage adjustment direction based on the current temperature and a preset working temperature range, wherein the preset working temperature range is a range of the working temperature to be met inside the TOSA when the wavelength of the light wave emitted by the TOSA meets the setting range; and adjust the control voltage applied to the TEC based on the voltage adjustment direction and the preset voltage stride.

In some embodiments, the adjusting unit 503 is further specifically configured to compare the current temperature with a minimum value within the preset working temperature range to obtain a first comparison result; and compare the current temperature with a maximum value within the preset working temperature range to obtain a second comparison result; and determine a voltage adjustment direction based on the first comparison result and the second comparison result;

wherein in a case where the first comparison result is that the current temperature is less than the minimum value and the second comparison result is that the current temperature is less than the maximum value, the voltage adjustment direction is to increase the control voltage applied to the TEC; and in a case where the first comparison result is that the current temperature is greater than the minimum value and the second comparison result is that the current temperature is greater than the maximum value, the voltage adjustment direction is to reduce the control voltage applied to the TEC.

In some embodiments, the adjusting unit 503 is further specifically configured as follows: in a case where the voltage adjustment direction is to increase the control voltage applied to the TEC, the adjusting the control voltage applied to the TEC based on the voltage adjustment direction and the preset voltage stride comprises: on the basis of the first control voltage, increasing the control voltage applied to the TEC by the preset voltage stride; correspondingly, the adjusting unit is further specifically configured as follows: in a case where the voltage adjustment direction is to reduce the control voltage applied to the TEC, on the basis of the first control voltage, reducing the control voltage applied to the TEC by the preset voltage stride.

In some embodiments, the adjusting unit 504 is specifically configured as follows: the updating the initial temperature compensation curve on the basis of the second control voltage comprises: composing the current ambient temperature and the second control voltage into a first coordinate, and obtaining a plurality of second coordinates on the initial temperature compensation curve, wherein the second coordinate is a coordinate composed of other ambient temperature except for the current ambient temperature and the corresponding control voltage on the initial temperature compensation curve; and refitting a temperature compensation curve based on the first coordinate and the plurality of second coordinates, wherein the refitted temperature compensation curve is the updated initial temperature compensation curve.

Alternatively, the adjusting unit 504 is specifically configured to determine an updating parameter corresponding to the initial temperature compensation curve based on the second control voltage and the initial temperature compensation curve; and update the initial temperature compensation curve based on a first coordinate composed of the current ambient temperature and the second control voltage and the updating parameter.

The apparatus for controlling a wavelength of an optical module and the method for controlling a wavelength of an optical module provided by the embodiments of the present disclosure are based on the same inventive concept. The terms used herein have been clearly described in the afore-mentioned method, and details are not described herein again.

The embodiments of the present disclosure further provide a storage medium having a computer program stored thereon, and the computer program, when executed by a processor, implements the steps of the method embodiment, and the afore-mentioned storage medium is computer readable, which comprises: a removable storage device, a read-only memory (ROM), a random access memory (RAM), a magnetic disk, or an optical disk and other various media that can store program code.

The embodiments of the present disclosure further provide an apparatus for controlling a wavelength of an optical module, the control apparatus comprising: a processor and a memory which is configured to store a computer program capable of operating on the processor, wherein the processor is configured to execute the steps of the above-mentioned method embodiment stored in the memory when the computer program is executed.

Figure 6:
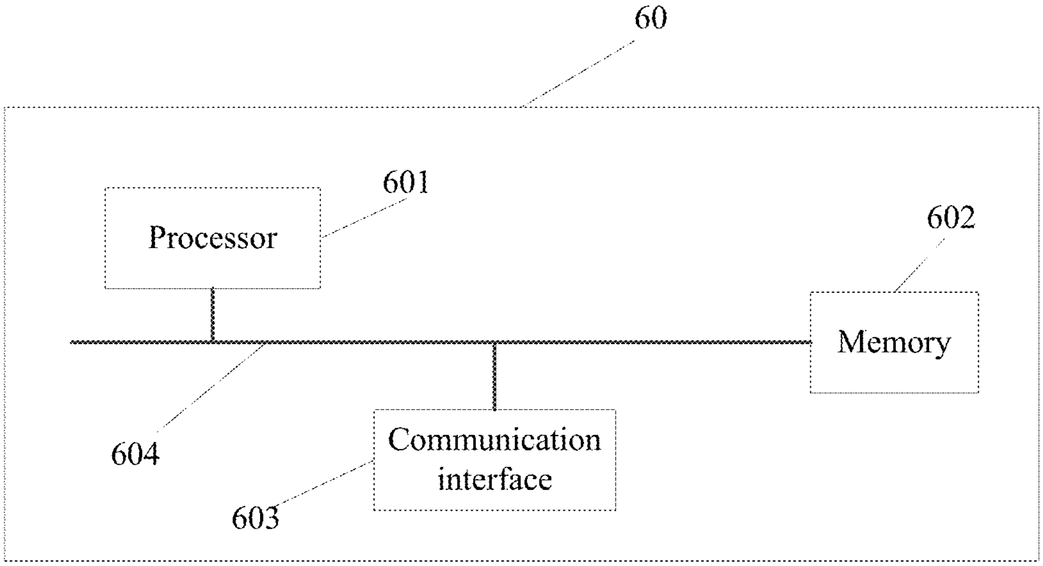
FIG. 6 is a schematic diagram of a hardware structure of an apparatus for controlling a wavelength of an optical module provided by an embodiment of the present disclosure.

FIG. 6 is a schematic diagram of a hardware structure of an apparatus for controlling a wavelength of an optical module provided by an embodiment of the present disclosure. The control apparatus 60 comprises: at least one processor 601 and at least one memory 602. Optionally, the control apparatus 60 may further comprise at least one communication interface 603. Each component of the control apparatus 60 is coupled together through a bus system 604, and it can be understood that the bus system 604 is configured to implement connection communication between these components. The bus system 604 further comprises a power bus, a control bus, and a state signal bus in addition to the data bus. However, for clarity of explanation, various buses are marked as bus system 604 in FIG. 6.

It may be understood that the memory 602 may be a volatile memory or a nonvolatile memory, and may also include both a volatile memory and a nonvolatile memory. The nonvolatile memory may be a read-only memory (ROM), a programmable read-only memory (PROM), an erasable programmable read-only memory (EPROM), an electrically erasable programmable read-only memory (EEPROM), a ferroMagnetic random access memory (FRAM), a flash memory, a magnetic surface memory, an optical disk, or a compact disc read-only memory (CD-ROM); the magnetic surface memory may be a disk storage or a magnetic tape storage. The volatile memory may be a random access memory (RAM), which is used as an external cache. By way of exemplary description but not restrictive description, many forms of RAMs may be used, for example, a static random access memory (SRAM), a synchronous static random access memory (SSRAM), a dynamic random access memory (DRAM), a synchronous dynamic random access memory (SDRAM), a double data rate synchronous dynamic random access memory (DDRSDRAM), a enhanced synchronous Dynamic Random Access Memory (ESDRAM), a syncLink dynamic random access memory (SLDRAM), a direct rambus random access memory (DRRAM). The memory 602 described in embodiments of the present disclosure includes, but is not limited to, these and any other proper types of memories.

The memory 602 in the embodiments of the present disclosure is configured to store various types of data to support the operation of the control apparatus 60. Examples of these data comprise: any computer program configured to operate on the control apparatus 60, such as an implementation of determining a voltage adjustment direction based on the current temperature and a preset working temperature range, and the like. A program for implementing the method of the embodiments of the present disclosure may be comprised in the memory 602.

The method disclosed in the embodiments of the present disclosure may be configured in a processor 601 or be implemented by a processor 601. The processor may be an integrated circuit chip with signal processing capacity. In an implementation process, each step of the above-mentioned method may be completed by an integrated logic circuit of hardware in the processor or instructions in the form of software. The above-mentioned processor may be a general-purpose processor, a digital signal processor (DSP), or other programmable logic devices, discrete gates or transistor logic devices, and discrete hardware components, etc. The processor may implement or execute various methods, steps, and logical block diagrams as disclosed in the embodiments of the present disclosure. The general-purpose processors can be microprocessors or any conventional processor or the like. The steps in combination with the method as disclosed in the embodiments of the present disclosure may be directly embodied to be executed and completed by a hardware decoding processor, or to be executed and completed by using a combination of hardware and software modules in the decoding processor. The software module may be located in a storage medium, and the storage medium is located in a memory, and the processor reads the information in the memory and completes the steps of the afore-mentioned method in combination with its hardware thereof.

In an exemplary embodiment, the control apparatus 60 may be implemented by one or more application specific integrated circuits (ASIC), DSP, programmable logic service (PLD), a complex programmable logic device (CPLD), a field-programmable gate array (FPGA), a general-purpose processor, a controller, a micro controller unit (MCU), a microprocessor, or other electronic component, and is configured to execute the above-mentioned method.

In the several embodiments provided in the present disclosure, it should be understood that the disclosed method and apparatus may be realized in other ways. The apparatus embodiments described above are merely schematic. For example, the division of the units is merely a logical function division, and there may be another division way in actual realization. For example, multiple units or components may be combined, or may be integrated into another system, or some features may be ignored or not executed. In addition, the coupling, or direct coupling, or the communication connection between the various components shown or discussed may be through some interfaces, and the indirect coupling or communication connection of devices or units may be electrical, mechanical or other forms. The unit described above as a separate component may or may not be physically separated, and the component displayed as a unit may or may not be a physical unit; that is, it may be located in one place or distributed to multiple network units. Some or all of the units may be selected according to actual needs to realize the purpose of the solutions of the present embodiments. In addition, each functional unit in each embodiment of the present disclosure may all be integrated into one processing module, or each unit may be separately used as a unit, or two or more units may be integrated into one unit; the above-mentioned integrated unit may be realized in a form of hardware or may be realized in a form of hardware plus software functional units.

The above description is only specific embodiments of the present disclosure, however, the protection scope of the present disclosure is not limited to it, and any person skilled in the art can easily think of changes or substitutions within the technical scope as disclosed by the present disclosure, and which should be included within the protection scope of the present disclosure. Therefore, the protection scope of the present disclosure should be subject to the protection scope of the claims.

What is claimed is:

1. A method for controlling a wavelength of an optical module, comprising:
- determining an initial temperature compensation curve corresponding to a transmitter optical subassembly TOSA in an optical module, wherein the initial temperature compensation curve is configured to reflect a relationship between a control voltage and an ambient temperature, and the control voltage is a control voltage applied to a thermo electric cooler TEC in the TOSA and is configured to control a wavelength of a light wave emitted by the TOSA;
- obtaining a first control voltage to be applied to the TEC according to a current ambient temperature and the initial temperature compensation curve; and controlling the TOSA to emit a first light wave based on the first control voltage, wherein a wavelength of the first light wave is a first wavelength;
- in a case where the first wavelength does not meet a setting range, adjusting the control voltage applied to the TEC until the control voltage applied to the TEC reaches a second control voltage, wherein the second control voltage is capable of controlling the TOSA to emit a second light wave at the current ambient temperature, and a wavelength of the second light wave is a second wavelength meeting the setting range; and updating the initial temperature compensation curve on the basis of the second control voltage.

2. The method of claim 1, wherein the determining an initial temperature compensation curve corresponding to a transmitter optical subassembly TOSA in an optical module comprises:
- obtaining a first relationship between a working temperature inside the TOSA and the ambient temperature; and obtaining a second relationship between the working temperature and the control voltage applied to the TEC;
- determining the initial temperature compensation curve corresponding to the TOSA based on the first relationship and the second relationship;
- wherein at the working temperature, the TOSA is capable of emitting a light wave with a wavelength meeting the setting range.

3. The method of claim 1, wherein the adjusting the control voltage applied to the TEC until the control voltage applied to the TEC reaches a second control voltage comprises:
- adjusting the control voltage applied to the TEC based on a preset voltage stride and a current temperature inside the TOSA, and determining whether the wavelength of the light wave emitted by the TOSA meets the setting range or not, until the control voltage applied to the TEC reaches the second control voltage.

4. The method of claim 3, wherein the adjusting the control voltage applied to the TEC based on a preset voltage stride and a current temperature inside the TOSA comprises:
- determining a voltage adjustment direction based on the current temperature and a preset working temperature range, wherein the preset working temperature range is a range of a working temperature to be met inside the TOSA when the wavelength of the light wave emitted by the TOSA meets the setting range;
- adjusting the control voltage applied to the TEC based on the voltage adjustment direction and the preset voltage stride.

5. The method of claim 4, wherein the determining a voltage adjustment direction based on the current temperature and a preset working temperature range comprises:
- comparing the current temperature with a minimum value within the preset working temperature range to obtain a first comparison result; and comparing the current temperature with a maximum value within the preset working temperature range to obtain a second comparison result;
- determining the voltage adjustment direction based on the first comparison result and the second comparison result;
- wherein in a case where the first comparison result is that the current temperature is less than the minimum value and the second comparison result is that the current temperature is less than the maximum value, the voltage adjustment direction is to increase the control voltage applied to the TEC; and in a case where the first comparison result is that the current temperature is greater than the minimum value and the second comparison result is that the current temperature is greater than the maximum value, the voltage adjustment direction is to reduce the control voltage applied to the TEC.

6. The method of claim 5, wherein in a case where the voltage adjustment direction is to increase the control voltage applied to the TEC, the adjusting the control voltage applied to the TEC based on the voltage adjustment direction and the preset voltage stride comprises: on the basis of the first control voltage, increasing the control voltage applied to the TEC by the preset voltage stride;

correspondingly, in a case where the voltage adjustment direction is to reduce the control voltage applied to the TEC, the adjusting the control voltage applied to the TEC based on the voltage adjustment direction and the preset voltage stride comprises: on the basis of the first control voltage, reducing the control voltage applied to the TEC by the preset voltage stride.

7. The method of claim 1, wherein the updating the initial temperature compensation curve on the basis of the second control voltage comprises: composing the current ambient temperature and the second control voltage into a first coordinate, and obtaining a plurality of second coordinates on the initial temperature compensation curve, wherein the second coordinate is a coordinate composed of other ambient temperature, except for the current ambient temperature, and the corresponding control voltage on the initial temperature compensation curve; refitting a temperature compensation curve based on the first coordinate and the plurality of second coordinates, wherein the refitted temperature compensation curve is the updated initial temperature compensation curve;

or, in a case where the initial temperature compensation curve is a segmented line, the updating the initial temperature compensation curve on the basis of the second control voltage comprises: determining an updating parameter corresponding to the initial temperature compensation curve based on the second control voltage and the initial temperature compensation curve; updating the initial temperature compensation curve based on a first coordinate composed of the current ambient temperature and the second control voltage and the updating parameter.

8. A storage medium having a computer program stored thereon, and the computer program, when executed by a processor, implements the steps of the method according a method for controlling a wavelength of an optical module, wherein the method comprises:

determining an initial temperature compensation curve corresponding to a transmitter optical subassembly TOSA in an optical module, wherein the initial temperature compensation curve is configured to reflect a relationship between a control voltage and an ambient temperature, and the control voltage is a control voltage applied to a thermo electric cooler TEC in the TOSA and is configured to control a wavelength of a light wave emitted by the TOSA;

obtaining a first control voltage to be applied to the TEC according to a current ambient temperature and the initial temperature compensation curve; and controlling the TOSA to emit a first light wave based on the first control voltage, wherein a wavelength of the first light wave is a first wavelength;

in a case where the first wavelength does not meet a setting range, adjusting the control voltage applied to the TEC until the control voltage applied to the TEC reaches a second control voltage, wherein the second control voltage is capable of controlling the TOSA to emit a second light wave at the current ambient temperature, and a wavelength of the second light wave is a second wavelength meeting the setting range; and updating the initial temperature compensation curve on the basis of the second control voltage.

9. The storage medium of claim 8, wherein the determining an initial temperature compensation curve corresponding to a transmitter optical subassembly TOSA in an optical module comprises:

obtaining a first relationship between a working temperature inside the TOSA and the ambient temperature; and obtaining a second relationship between the working temperature and the control voltage applied to the TEC;

determining the initial temperature compensation curve corresponding to the TOSA based on the first relationship and the second relationship;

wherein at the working temperature, the TOSA is capable of emitting a light wave with a wavelength meeting the setting range.

10. The storage medium of claim 8, wherein the adjusting the control voltage applied to the TEC until the control voltage applied to the TEC reaches a second control voltage comprises:

adjusting the control voltage applied to the TEC based on a preset voltage stride and a current temperature inside the TOSA, and determining whether the wavelength of the light wave emitted by the TOSA meets the setting range or not, until the control voltage applied to the TEC reaches the second control voltage.

11. The storage medium of claim 10, wherein the adjusting the control voltage applied to the TEC based on a preset voltage stride and a current temperature inside the TOSA comprises:

determining a voltage adjustment direction based on the current temperature and a preset working temperature range, wherein the preset working temperature range is a range of a working temperature to be met inside the TOSA when the wavelength of the light wave emitted by the TOSA meets the setting range;

adjusting the control voltage applied to the TEC based on the voltage adjustment direction and the preset voltage stride.

12. The storage medium of claim 11, wherein the determining a voltage adjustment direction based on the current temperature and a preset working temperature range comprises:

comparing the current temperature with a minimum value within the preset working temperature range to obtain a first comparison result; and comparing the current temperature with a maximum value within the preset working temperature range to obtain a second comparison result;

determining the voltage adjustment direction based on the first comparison result and the second comparison result;

wherein in a case where the first comparison result is that the current temperature is less than the minimum value and the second comparison result is that the current temperature is less than the maximum value, the voltage adjustment direction is to increase the control voltage applied to the TEC; and in a case where the first comparison result is that the current temperature is greater than the minimum value and the second comparison result is that the current temperature is greater than the maximum value, the voltage adjustment direction is to reduce the control voltage applied to the TEC.

13. The storage medium of claim 12, wherein in a case where the voltage adjustment direction is to increase the control voltage applied to the TEC, the adjusting the control voltage applied to the TEC based on the voltage adjustment direction and the preset voltage stride comprises: on the basis of the first control voltage, increasing the control voltage applied to the TEC by the preset voltage stride;

correspondingly, in a case where the voltage adjustment direction is to reduce the control voltage applied to the TEC, the adjusting the control voltage applied to the TEC based on the voltage adjustment direction and the preset voltage stride comprises: on the basis of the first control voltage, reducing the control voltage applied to the TEC by the preset voltage stride.

14. The storage medium of claim 8, wherein the updating the initial temperature compensation curve on the basis of the second control voltage comprises: composing the current ambient temperature and the second control voltage into a first coordinate, and obtaining a plurality of second coordinates on the initial temperature compensation curve, wherein the second coordinate is a coordinate composed of other ambient temperature, except for the current ambient temperature, and the corresponding control voltage on the initial temperature compensation curve; refitting a temperature compensation curve based on the first coordinate and the plurality of second coordinates, wherein the refitted temperature compensation curve is the updated initial temperature compensation curve;

or, in a case where the initial temperature compensation curve is a segmented line, the updating the initial temperature compensation curve on the basis of the second control voltage comprises: determining an updating parameter corresponding to the initial temperature compensation curve based on the second control voltage and the initial temperature compensation curve; updating the initial temperature compensation curve based on a first coordinate composed of the current ambient temperature and the second control voltage and the updating parameter.

15. An apparatus for controlling a wavelength of an optical module, comprising a processor, and a memory configured to store a computer program capable of operating on the processor, wherein the processor is configured to execute the steps of the method according to a method for controlling a wavelength of an optical module, when operating the computer program, wherein the method comprises:

determining an initial temperature compensation curve corresponding to a transmitter optical subassembly TOSA in an optical module, wherein the initial temperature compensation curve is configured to reflect a relationship between a control voltage and an ambient temperature, and the control voltage is a control voltage applied to a thermo electric cooler TEC in the TOSA and is configured to control a wavelength of a light wave emitted by the TOSA;

obtaining a first control voltage to be applied to the TEC according to a current ambient temperature and the initial temperature compensation curve; and controlling the TOSA to emit a first light wave based on the first control voltage, wherein a wavelength of the first light wave is a first wavelength;

in a case where the first wavelength does not meet a setting range, adjusting the control voltage applied to the TEC until the control voltage applied to the TEC reaches a second control voltage, wherein the second control voltage is capable of controlling the TOSA to emit a second light wave at the current ambient temperature, and a wavelength of the second light wave is a second wavelength meeting the setting range; and updating the initial temperature compensation curve on the basis of the second control voltage.

16. The apparatus of claim 15, wherein the determining an initial temperature compensation curve corresponding to a transmitter optical subassembly TOSA in an optical module comprises:

obtaining a first relationship between a working temperature inside the TOSA and the ambient temperature; and obtaining a second relationship between the working temperature and the control voltage applied to the TEC;

determining the initial temperature compensation curve corresponding to the TOSA based on the first relationship and the second relationship;

wherein at the working temperature, the TOSA is capable of emitting a light wave with a wavelength meeting the setting range.

17. The apparatus of claim 15, wherein the adjusting the control voltage applied to the TEC until the control voltage applied to the TEC reaches a second control voltage comprises:

adjusting the control voltage applied to the TEC based on a preset voltage stride and a current temperature inside the TOSA, and determining whether the wavelength of the light wave emitted by the TOSA meets the setting range or not, until the control voltage applied to the TEC reaches the second control voltage.

18. The apparatus of claim 17, wherein the adjusting the control voltage applied to the TEC based on a preset voltage stride and a current temperature inside the TOSA comprises:

determining a voltage adjustment direction based on the current temperature and a preset working temperature range, wherein the preset working temperature range is a range of a working temperature to be met inside the TOSA when the wavelength of the light wave emitted by the TOSA meets the setting range;

adjusting the control voltage applied to the TEC based on the voltage adjustment direction and the preset voltage stride.

19. The apparatus of claim 18, wherein the determining a voltage adjustment direction based on the current temperature and a preset working temperature range comprises:

comparing the current temperature with a minimum value within the preset working temperature range to obtain a first comparison result; and comparing the current temperature with a maximum value within the preset working temperature range to obtain a second comparison result;

determining the voltage adjustment direction based on the first comparison result and the second comparison result;

wherein in a case where the first comparison result is that the current temperature is less than the minimum value and the second comparison result is that the current temperature is less than the maximum value, the voltage adjustment direction is to increase the control voltage applied to the TEC; and in a case where the first comparison result is that the current temperature is greater than the minimum value and the second comparison result is that the current temperature is greater than the maximum value, the voltage adjustment direction is to reduce the control voltage applied to the TEC.

20. The apparatus of claim 19, wherein in a case where the voltage adjustment direction is to increase the control voltage applied to the TEC, the adjusting the control voltage applied to the TEC based on the voltage adjustment direction and the preset voltage stride comprises: on the basis of the first control voltage, increasing the control voltage applied to the TEC by the preset voltage stride;

correspondingly, in a case where the voltage adjustment direction is to reduce the control voltage applied to the TEC, the adjusting the control voltage applied to the TEC based on the voltage adjustment direction and the preset voltage stride comprises: on the basis of the first control voltage, reducing the control voltage applied to the TEC by the preset voltage stride.

* * * * *